United States Patent [19]
Cromwell et al.

[11] Patent Number: 5,901,040
[45] Date of Patent: May 4, 1999

[54] HEAT SINK AND FARADAY CAGE ASSEMBLY FOR A SEMICONDUCTOR MODULE AND A POWER CONVERTER

[75] Inventors: Stephen Daniel Cromwell, Roseville, Calif.; Christian Belady, Dallas, Tex.

[73] Assignee: Hewlett-Packard Company, Palo Alto, Calif.

[21] Appl. No.: 08/902,770

[22] Filed: Jul. 30, 1997

[51] Int. Cl.$^6$ ........................................ H05K 7/20
[52] U.S. Cl. .................. 361/704; 361/683; 361/704; 361/713; 361/818; 257/707; 257/714; 174/35 R; 165/80.2
[58] Field of Search .................... 361/683, 676, 361/687, 690–697, 699, 700–715, 813–818, 721, 752; 165/80.3, 80.4, 104.33, 104.14, 104.21, 80.2, 185, 104.2, 104.32; 257/683, 723, 700–714; 174/35 R, 16.3, 52.1, 252, 35 MS

[56] References Cited

U.S. PATENT DOCUMENTS

| | | |
|---|---|---|
| 4,067,237 | 1/1978 | Arcella . |
| 4,120,019 | 10/1978 | Arii et al. ................................ 361/385 |
| 4,638,854 | 1/1987 | Noren . |
| 4,675,783 | 6/1987 | Murase et al. ........................... 361/385 |
| 4,829,432 | 5/1989 | Hershberger et al. ................... 361/424 |
| 4,858,093 | 8/1989 | Sturgeon . |
| 4,951,740 | 8/1990 | Peterson et al. . |
| 4,975,825 | 12/1990 | Huss et al. . |
| 5,010,292 | 4/1991 | Lyle, Jr. . |
| 5,118,925 | 6/1992 | Mims et al. . |
| 5,131,859 | 7/1992 | Bowen et al. . |
| 5,136,119 | 8/1992 | Leyland . |
| 5,162,974 | 11/1992 | Currie . |
| 5,229,915 | 7/1993 | Ishibashi et al. . |
| 5,311,397 | 5/1994 | Harshberger et al. . |
| 5,313,099 | 5/1994 | Tata et al. . |
| 5,339,214 | 8/1994 | Nelson . |
| 5,398,822 | 3/1995 | McCarthy et al. . |
| 5,461,541 | 10/1995 | Wentland, Jr. et al. . |
| 5,475,606 | 12/1995 | Muyshondt et al. . |
| 5,504,650 | 4/1996 | Katsui et al. . |
| 5,508,908 | 4/1996 | Kazama et al. ........................ 363/141 |
| 5,513,070 | 4/1996 | Xie et al. . |
| 5,522,602 | 6/1996 | Kaplo et al. . |
| 5,579,827 | 12/1996 | Chung . |
| 5,587,920 | 12/1996 | Muyshondt et al. . |
| 5,592,391 | 1/1997 | Muyshondt et al. . |
| 5,598,320 | 1/1997 | Toedtman et al. . |
| 5,621,635 | 4/1997 | Takiar . |

*Primary Examiner*—Leo P. Picard
*Assistant Examiner*—Michael Datskovsky
*Attorney, Agent, or Firm*—Christine H. Smith

[57] ABSTRACT

The invention is a heat sink assembly for the removal of heat from semiconductor and power converter modules. The packaging design for semiconductor modules and power converter modules provides efficient heat removal and a tight Faraday Cage. There is a heat transfer layer sandwiched between a CPU module and a power converter module. The heat sink assembly includes a heat transfer layer, a fin stack, and a series of heat pipes. The heat transfer layer has a slot for passage of power cables and sense lines which connects both the CPU module and the power converter module, and the power converter module and the printed circuit board. The heat sink chamber also serves as a Faraday Cage and thus attenuates EMI from the semiconductor module, the power converter module, the power cables, and the sense lines.

4 Claims, 3 Drawing Sheets

HEAT SINK AND FARADAY CAGE ASSEMBLY FOR A SEMICONDUCTOR MODULE AND A POWER CONVERTER

FIELD OF THE INVENTION

The present invention relates generally to heat sinks and Faraday Cages for semiconductor modules and power converter modules. More particularly, the present invention relates to a heat sink which includes a thermally conductive plate, a plurality of heat pipes, and a fin stack which cooperate in order to dissipate heat from both a semiconductor module and a power converter module. The packaging is integrated such that both modules and the related power cables and sense lines are contained within a Faraday Cage.

BACKGROUND OF THE INVENTION

As the state of development of semiconductor components has moved to increased levels of integration, the amount of heat these devices generate has significantly increased. Components handling large quantities of current such as power transistors and integrated circuits generate large amounts of heat. For instance, as indicated in U.S. Pat. No. 5,598,320, it is commonly known that the current generation of P5 microprocessor chips, such as Intel Corporation's Pentium® Pro microprocessor, generate a significant amount of heat during operation. If this heat is not adequately removed, the increased temperatures generated by the semiconductor components will damage the components. As the computer industry moves toward ever increasing integration of these components, this will continue to be a common problem for the industry.

One approach for solving the heat dissipation problem is to include components which transfer or dissipate heat by means of heat sinks, including heat dissipation plates, fin stacks, and heat pipes. These devices keep the microprocessor chip and related circuitry below the maximum recommended operating temperature by transferring or dissipating heat away from the chip and related circuitry.

A typical heat sink component dissipates heat from a semiconductor component by maintaining thermal contact with the component. The thermal contact area is maximized for the efficient dissipation of heat. A heat sink includes a plate made up of conductive metal and a thermal interface to optimize the heat transfer from the semiconductor component. The heat sink transfers heat from the semiconductor component to less heat-sensitive locations. A typical heat sink maintains thermal contact between the thermal conducting plate and the semiconductor component to dissipate heat in an efficient manner.

A typical heat sink includes a plurality of protrusions, called fins, that increase the overall surface area of the heat sink which increases the heat dissipation capacity, resulting in a more efficient heat transfer system. A fin assembly can be comprised of plate-like radiating fins or pin-like radiating fins and protrudes from a heat sink body for efficient heat dissipation. Increasing the heat dissipating surface area improves the heat dissipating efficiency of the heat sink component. Fin stacks can be particularly effective at dissipating heat due to the increased surface area. The enlarged surface area created by the fins dissipates the heat generated by the semiconductor components more efficiently than a heat sink thermal plate alone.

Heat pipes are another effective method of transferring heat from the critical area of the semiconductor components and related circuitry to the heat fins. As discussed in U.S. Pat. No. 5,598,320, the heat pipe generally improves the heat dissipation features of a heat sink by carrying heat from the microprocessor component and related circuitry to an area where there is sufficient air flow to effectively dissipate heat.

A heat pipe is situated in thermal contact with a semiconductor component such that heat is transferred from the area surrounding the semiconductor component to the fin stack. A heat pipe may be a hollow tube that is filled, in part, with a fluid such as water. As discussed in U.S. Pat. No. 4,675,783, heat pipes have been found generally to cool more efficiently than heat sinks with heat dissipating plates. Recently, more computer vendors have combined heat sink and heat pipe solutions to increase efficiency for overall heat dissipation in semiconductor devices.

There is continuing pressure to lower the cost of computer systems. This, coupled with the increase in semiconductor component integration have created a need to provide for the control of a variety of thermal conditions in a low cost package.

A power converter converts one form of energy to another. As discussed in U.S. Pat. No. 5,621,635, heat sinks have been attached to the outside of a printed circuit board containing a power converter, to aid in heat dissipation. Some of the problems addressed by past power converter and heat sink technologies include: the large amount of space required on the circuit board; the general inefficiency of heat dissipation when large numbers of thermal interfaces are used; the cost of manufacturing which can be high if ceramic substrate or thermally enhanced boards are used; and the difficulty in maintaining high degrees of reliability. One typical solution to the problem of minimizing heat dissipation from a power converter is to ensure that intimate physical contact between a power converter and a heat sink is achieved.

Another packaging problem in the industry is containing electromagnetic (EMI) or radio frequency (RFI) disturbances generated by semiconductor components. Hereinafter EMI and RFI disturbances will be referred to as "EMI". A Faraday Cage solution to the EMI problem is an enclosure which attenuates EMI emission. It is designed to effectively shield EMI disturbances while permitting air flow for dissipation of heat. As discussed in U.S. Pat. No. 5,398,822, EMI is contained by enclosing the area surrounding semiconductor modules in order to prevent EMI discharge. This works in counterbalance to the need to open up the areas surrounding semiconductor modules for the dissipation of heat. EMI enclosures often are made of sheet metal with a plurality of small holes for ventilation. EMI enclosures are often coupled with the use of fans to move air through the small ventilation holes to accelerate heat dissipation.

The problem with the past technology is that semiconductor modules and power converter modules generate significant heat which must be efficiently dissipated. They also generate EMI which must be shielded. This has led to difficulties in designing inexpensive packaging of semiconductor modules in which heat dissipance and EMI reduction are efficiently controlled.

SUMMARY OF THE INVENTION

The present invention packages CPU modules and power converter modules to efficiently dissipate heat and shield EMI emissions. The present invention also meets the constraints of new CPU modules by minimizing the length of the power cables connected between the CPU and the power converter modules. The preferred embodiment of the invention sandwiches a heat transfer layer between a power converter module and a CPU module. The heat transfer layer thermally communicates with heat pipes as an evaporator, and the heat pipes thermally communicate with the fin stacks which act as condensers, to efficiently dissipate heat. This package also reduces EMI in addition to efficiently transferring and dissipating heat.

Some CPU's will have power requirements that constrain the length of the cable between the power converter module and the CPU module. In addition to the above, the preferred embodiment of the present invention places the CPU module in tight proximity to the power converter module while allowing the power converter module to reside off of the printed circuit board. The heat transfer layer may have a passageway for the power cables connecting the CPU module to the power converter module. The heat transfer layer is connected to both the CPU module and the power converter module, and contains a passage providing for an electrical power transfer and signal transfer between both the power converter module and the CPU module and between the power converter module and the printed circuit board.

The heat sink assembly preferably includes the heat transfer layer which is thermally coupled with the CPU module and the power converter module. The heat sink assembly preferably includes a fin stack for increased heat dissipation surface area. The heat sink assembly also preferably includes a series of heat pipes inserted into the heat transfer layer for carrying heat from the microprocessor component and related circuitry to an area where there is sufficient air flow to effectively dissipate heat.

The heat transfer layer is preferably joined to the bottom side of the power converter module and to the top side of the CPU module. Contact with the heat transfer layer is effected by means of a thermal grease, a thermal pad, or any other type of thermal interface material. The CPU module and CPU mounting bracket combination are tightly connected to the heat transfer layer. The CPU module, the power cables, and the power converter module are contained within the Faraday Cage.

The Faraday Cage may include an EMI can for EMI shielding of the power converter module. Additionally, it also may include an EMI attenuating sleeve for EMI shielding of the CPU module, the power cables, and the sense lines. The EMI attenuating sleeve is located between the printed circuit board and the heat transfer layer and is attached to the printed circuit board to ensure a good electrical connection. The combination of the EMI can, EMI attenuating sleeve, heat transfer layer, and ground plane of the printed circuit board complete the Faraday Cage. Primary power for the power converter originates from the circuit board and is transferred to the power converter module through the slot in the heat transfer layer.

The following description and drawings will provide other aspects and advantages of the present invention. Taken together they will illustrate the principles of the invention.

DESCRIPTION OF THE PREFERRED EMBODIMENTS

Figure 1:
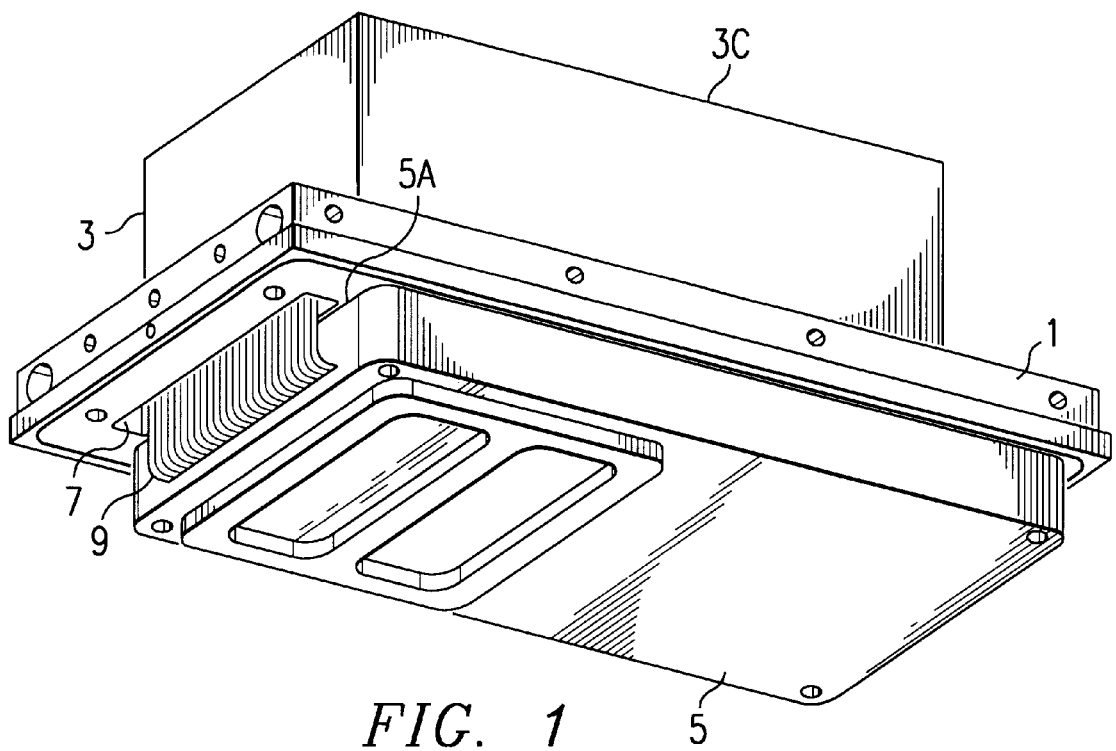
FIG. 1 is a perspective view of the isothermal layer sandwiched between the power converter module and the CPU module, and includes the power cable and the passage for the power cables.

The present invention packages a semiconductor module and a power converter module to efficiently dissipate heat and shield EMI, while maintaining the length restrictions imposed by some CPU's. This package is encased in a Faraday Cage with an isothermal layer sandwiched between a semiconductor module, and a power converter module. The isothermal layer thermally communicates with heat pipes and the heat pipes thermally communicate with fin stacks to efficiently dissipate heat.

Semiconductor modules and power converter modules both generate significant heat which must be efficiently dissipated, and they also generate EMI which must be shielded and reduced. There has been a need to package these modules and power cables to provide both efficient heat dissipation and EMI shielding. These requirements put conflicting constraints on the packaging design that are addressed by the present invention.

The preferred embodiment of the present invention places the semiconductor (CPU) module in tight proximity to the power converter module while not requiring the power converter module to reside on a circuit board. While the CPU module resides on the circuit board, removing the power converter module from the circuit board saves about six inches on the circuit board. Further, this shortens traces and costs less to manufacture, as the overall design is less complex. The preferred embodiment is designed with a tight Faraday Cage, with fewer parts than previous embodiments of a Faraday Cage.

Another problem solved by the present invention is the requirement of short cable length imposed by some CPU's. The short cable length between the CPU module and the power converter module reduces the potential for voltage drop from the power converter to the CPU module by enabling close proximity between the CPU module and the power converter module.

While the heat dissipation layer or heat transfer layer is referred to as an isothermal layer, the term isothermal layer is not used as a limiting term. It will be appreciated that the CPU module can be any type of semiconductor module that requires power from an associated power supply module and removal of excess heat.

In the following detailed description and in the several figures of the drawings, like elements are identified with like reference numerals.

Referring to FIG. 1 there is shown a perspective view of novel packaging of a power converter module 3 on top of an isothermal layer 1, with power connections 9 (shown in phantom) from the power converter module 3 to a CPU module 5 transversing through a slot 7 in the isothermal layer 1. The isothermal layer 1 is sandwiched between the power converter module 3 and the CPU module 5 to provide heat dissipance for both the power converter module 3 and the CPU module 5. In this novel, stacked module packaging, the top surface of the isothermal layer 1 is attached to the bottom surface of the power converter module 3C; and the bottom surface of the isothermal layer 1 is attached to the top surface of the CPU module 5A.

Figure 2:
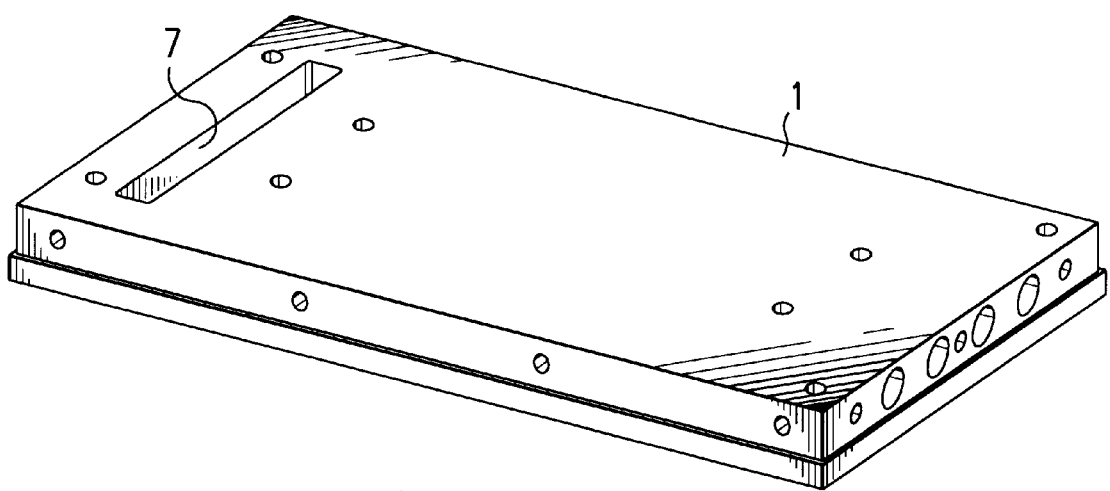
FIG. 2 is a cut away view of the isothermal layer with a slot for the power cable.

FIG. 2 is a perspective view of the isothermal layer 1 with the slot 7 for the power cable 9 (as shown in FIG. 1). The slot 7 is cut into the isothermal layer 1 from the top surface to the bottom surface of the isothermal layer 1, running parallel to the side edge of the isothermal layer 1. The slot 7 provides a passageway for electrical power cables and sense lines 9 between the power converter module 3 and the CPU module 5 (as shown in FIG. 1), a novel way of distributing the power to the CPU module 5. The slot 7 also provides a passageway for an electrical power cables and sense lines 9 (as shown in FIG. 1) from the circuit board 19 (which will be discussed later and as shown in FIG. 3) to the power converter module 3 (as shown in FIG. 1).

Figure 3:
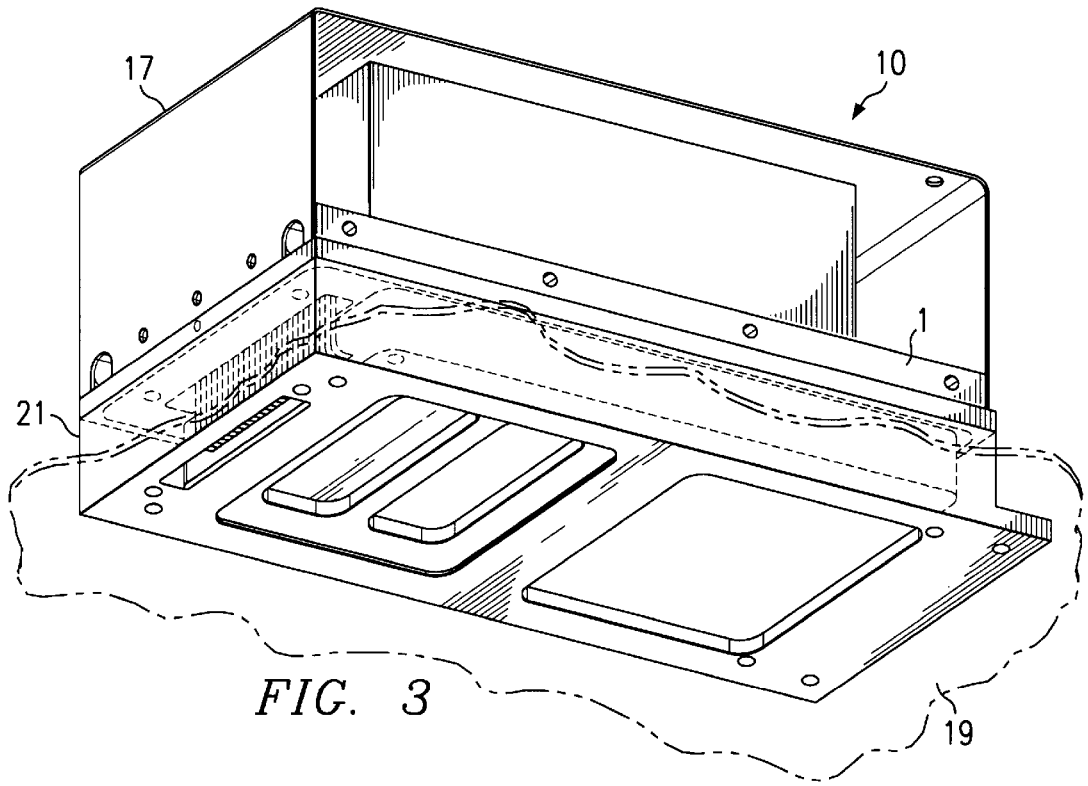
FIG. 3 is a perspective view of the Faraday Cage.

A Faraday Cage 10 as shown in FIG. 3, requires a seal such that EMI is contained within the Faraday Cage 10. It will be appreciated that EMI containment may be merely EMI reduction. The Faraday Cage 10 encases the CPU module 5, the power cables 9, the sense lines 9, and the power converter module 3 (which are shown in FIG. 1). The stacked packaging of the CPU module 5 and the power converter module 3 makes the problem of solving EMI containment easier than addressing EMI containment separately for each module and the cables, in that there is a tighter Faraday Cage 10.

The Faraday Cage 10 includes an EMI can 17 which fits over the power converter module 3 (as shown in FIG. 1), and is a shield for EMI from the power converter module 3. The Faraday Cage 10 further includes the EMI attenuating sleeve 21 and the isothermal layer 1. The side of the isothermal layer 1 in the same plane as the EMI can 17 and the EMI attenuating sleeve 21 is a part of the Faraday Cage 10. The EMI attenuating sleeve 21 is connected between the isothermal layer 1 and the circuit board 19. The EMI attenuating sleeve 21 fits around the CPU module 5, the power cables 9, and the sense lines 9 (shown in FIG. 1), and above the circuit board 19; and attenuates the EMI emitted from the CPU module 5, the power cables 9, and the sense lines 9. A ground plane on the bottom of the circuit board 19 completes the Faraday Cage 10.

Figure 5:
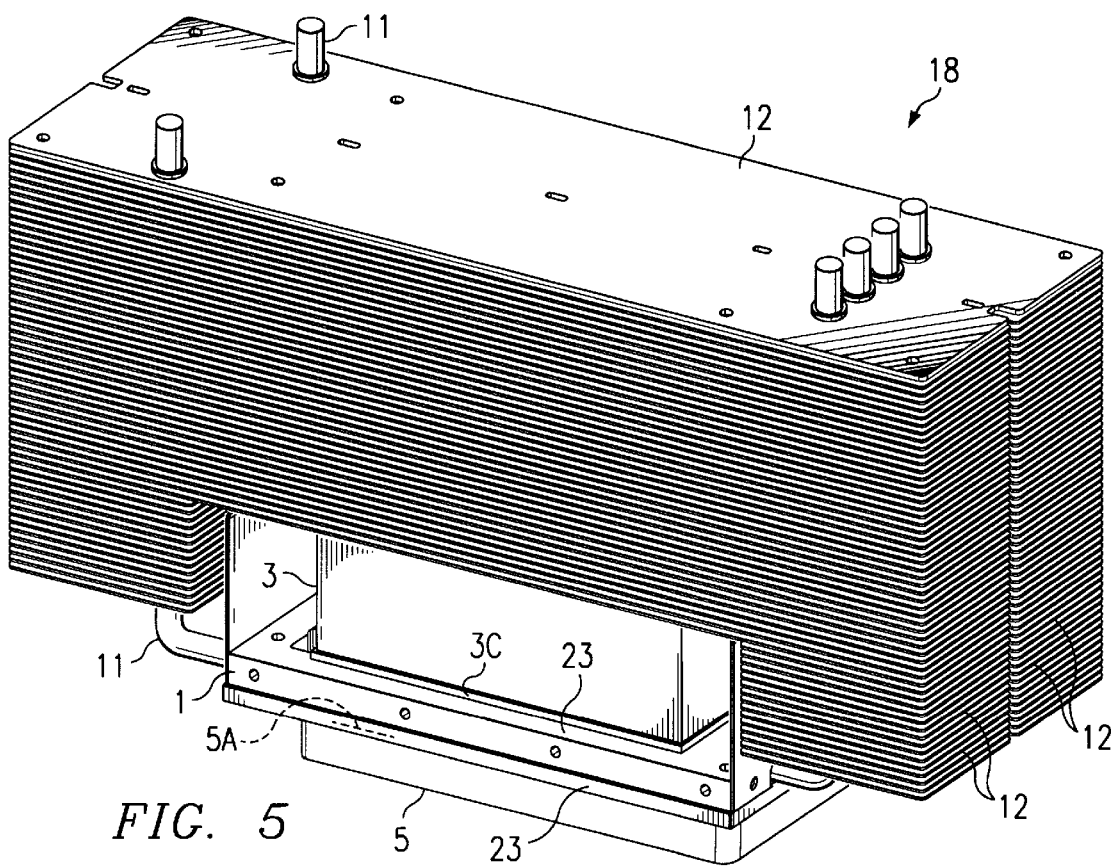
FIG. 5 is a perspective view of the heat sink assembly.
Figure 4:
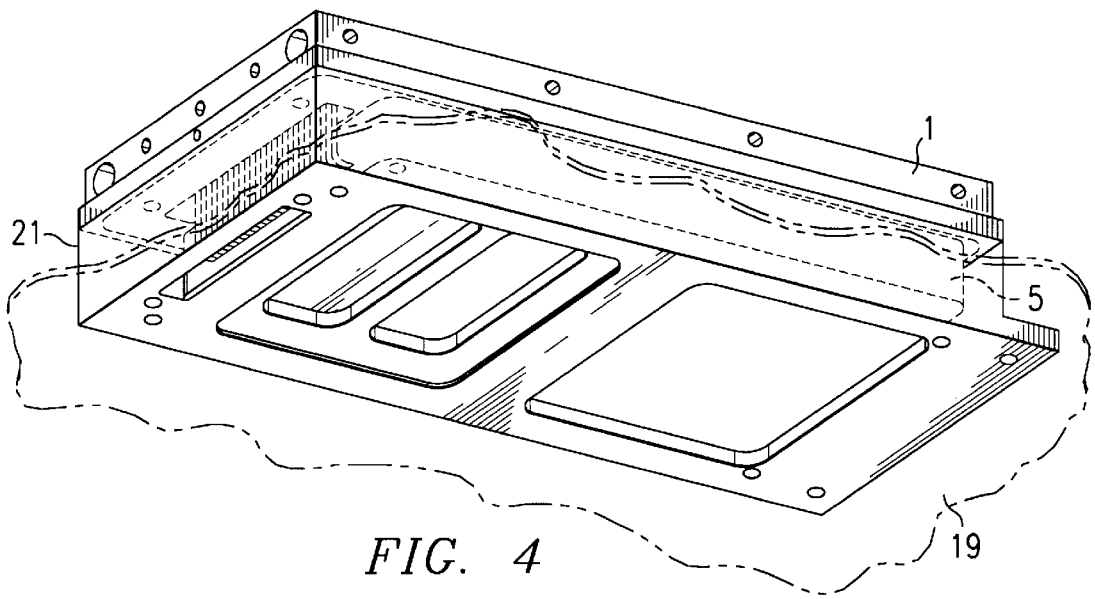
FIG. 4 is a perspective view of the isothermal layer, mounted and connected to the CPU module and circuit board with a transparent perspective view of the EMI attenuating sleeve.

It will be appreciated that the isothermal layer 1 operates as a shared mounting point for the EMI can 17 and the EMI attenuating sleeve 21. The CPU module 5 mounting, as shown in FIG. 4, only contacts one side of the isothermal layer 1, thus leaving the other side of the isothermal layer 1 for contact with other modules. The CPU module 5 is sandwiched between the circuit board 19 and the isothermal layer 1 and maintains the necessary thermal contact with the isothermal layer 1. The EMI attenuating sleeve 21 is attached to the circuit board 19 on the face of the circuit board 19. This attachment ensures that there is minimal pressure on the CPU module 5 and the circuit board 19, by placing the load from the Faraday Cage 10 (shown in FIG. 3) and the heat sink assembly chamber 18 (which will be discussed later and as shown in FIG. 5) on the EMI attenuating sleeve 21. The attachment creates an EMI seal and also provides rigidity to the circuit board 19.

The Faraday Cage 10 (as shown in FIG. 3) provides containment for EMI while serving as a heat sink assembly 18 chamber as shown in FIG. 5. The conflicting design requirements of EMI containment, thermal control, and cable length restrictions have been solved in the present invention by its packaging. The heat sink assembly 18 is a heat dissipation device consisting of a CPU module 5 and a power converter module 3, both attached to an isothermal layer 1. The top surface of the isothermal layer 1 is attached to the bottom surface of the power converter module 3C; and the bottom surface of the isothermal layer 1 is attached to the top surface of the CPU module 5A (as shown in FIG. 4). The isothermal layer 1 thermally communicates with both the power converter module 3 and the CPU module 5 for the purpose of dissipating heat from these modules. The attachment of the isothermal layer 1 to the CPU module 5 and the power converter module 3 is effected by a thermal interface through a thermal contact lamination material such as a thermal grease or a thermal pad 23.

Figure 6:
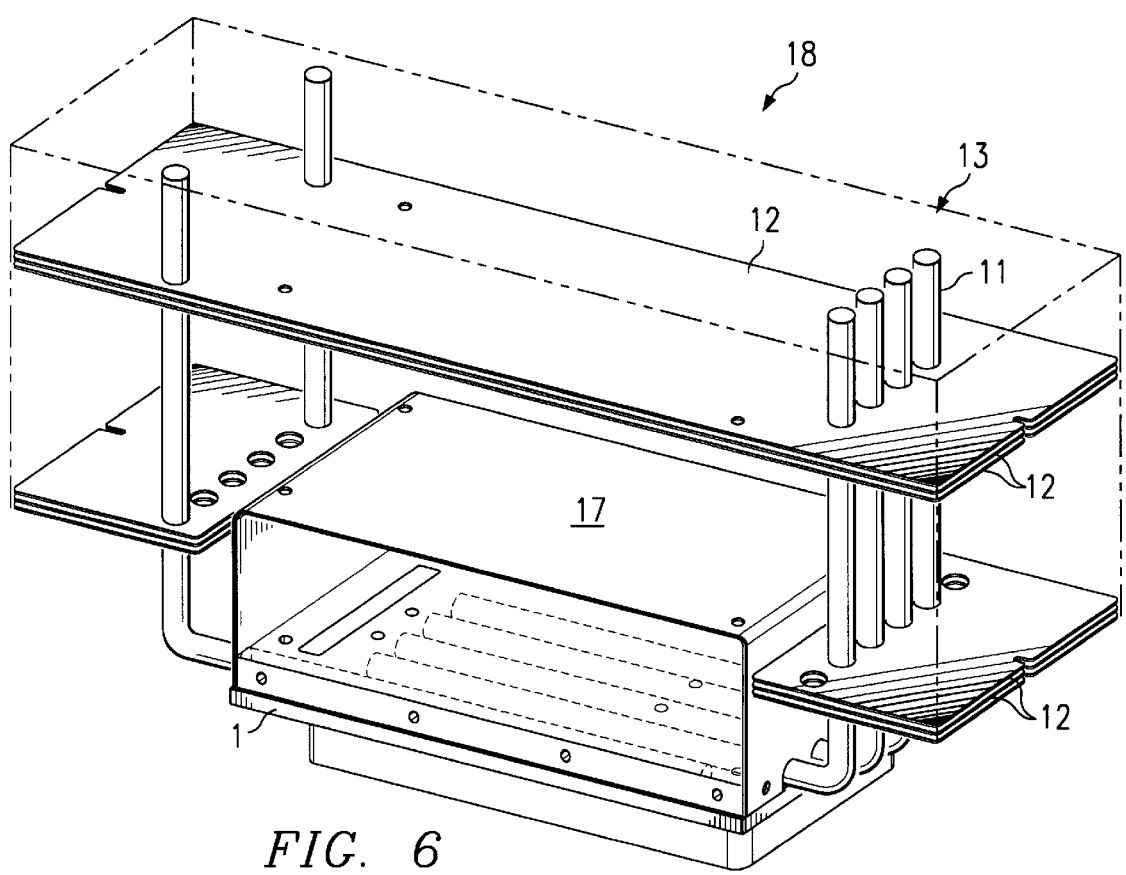
FIG 6 is a transparent perspective view of the heat sink assembly with the heat pipes in the heat transfer layer exposed.

The transparent perspective view of the exposed heat pipes 11 as shown in FIG. 6, is an innovative method of packaging the fin stacks 13 and heat pipes 11 to efficiently cool the isothermal layer 1. The heat sink assembly 18 consists of a fin stack 13 for increased heat dissipation surface area, and a series of heat pipes 11 to direct the heat away from the critical components and toward the fin stack 13. The bottom of the fin stack 13 is located above the top surface of the EMI can 17. The fin stack 13 is a series of fins 12 which are layered above the isothermal layer 1. The fins 12 extend over both sides of the EMI can edges 17, and thus flank the EMI can 17.

The bottom of the heat pipes 11 are inserted into the parallel side edges 1A of the isothermal layer 1 and are bent at about a 90 degree angle as they exit the isothermal layer 1. The heat pipes 11 extend upward, away from critical components which generate heat. The heat pipes 11 extend through the fin stack 13 and terminate outside the top surface of the fin stack 13 as shown in FIG. 6.

The invention is an improvement over the prior art in that it provides a packaging which allows the CPU module to be closely co-located with the power converter module without requiring the power converter module to reside on the circuit board. This is done, in part, by the passage of the power cables and sense lines through the isothermal layer. The power cables and sense lines are connected between both the power converter module and the CPU module and between the power converter module and the circuit board. In addition to saving space on the circuit board by removing the power converter module from the circuit board, this design shortens traces for better system performance, and costs less to manufacture as the overall design is smaller. This compact design also improves the EMI seal for the Faraday Cage enclosure. Additionally, this solves the new problem of minimizing cable length between the power converter module and the CPU module which reduces voltage drop from the power converter module to the CPU module.

Although a preferred embodiment of the invention has been described and illustrated, the invention is not to be limited to the specific forms or arrangements of parts so described and illustrated. The invention is limited only by the claims.

What is claimed is:

1. A heat sink and EMI emission attenuating chamber assembly having a semiconductor module and a power converter module, said semiconductor module and said power converter module being electrically connected by power cables and sense lines comprising;

a heat transfer layer, coupled to said semiconductor module and to said power converter module, said heat transfer layer having a passageway connecting electrical power between said power converter module and said semiconductor module;

wherein said power converter module provides electrical power to said semiconductor module through said passageway; and wherein said heat transfer layer thermally communicates with at least one heat pipe; and at least one fin stack; and wherein said heat pipes and said fin stacks cooperate with said heat transfer layer to dissipate heat; and an EMI emission attenuating chamber enclosing said semiconductor module, said power converter module said power cables and said sense lines; wherein said chamber attenuates EMI emissions; said chamber comprises:
an EMI can connected to said heat transfer layer that encloses said power converter module,
a printed circuit board having a ground plane, and
an EMI attenuated sleeve connected between said ground plane of said printed circuit board and said heat transfer layer that encloses said semiconductor module.

2. A heat sink and an EMI emission attenuating chamber assembly as set forth in claim 5, wherein said heat transfer layer contacts said semiconductor module and said power converter module through a thermally conductive interface.

3. A heat sink and EMI enclosure assembly having a CPU module, a printed circuit board, power connectors, sense lines, and a CPU module power converter module, wherein said CPU module is mounted to said printed circuit board, comprising;

an isothermal layer thermally connected to said power converter module and thermally connected to said CPU module, wherein said isothermal layer is sandwiched between said power converter module and said CPU module;

a slot in said isothermal layer and having a passage for said power connectors between said CPU module and said power converter module;

at least one heat pipe inserted into and thermally communicating with said isothermal layer;

at least one fin stack which thermally communicate with said heat pipes; and an EMI enclosure comprising an EMI can and an EMI attenuated sleeve, said EMI enclosure being connected to said printed circuit board and thereby forming a Faraday Cage.

4. A heat sink and EMI enclosure assembly as set forth in claim 3, wherein said power converter module and said CPU module are coupled to said isothermal layer by a thermal contact lamination material.

* * * * *

UNITED STATES PATENT AND TRADEMARK OFFICE
CERTIFICATE OF CORRECTION

PATENT NO.    : 5,901,040
DATED         : May 4, 1999
INVENTOR(S)   : Cromwell et al.

Page 1 of 1

It is certified that error appears in the above-identified patent and that said Letters Patent is hereby corrected as shown below:

<u>Column 7,</u>
Line 16, delete "claim 5" and insert therefor -- claim 1 --

Signed and Sealed this

Fifteenth Day of April, 2003

JAMES E. ROGAN
*Director of the United States Patent and Trademark Office*